United States Patent [19]

Held

[11] 4,264,692

[45] Apr. 28, 1981

[54] PHOTOPOLYMERIZED ELEMENTS HAVING SELECTIVELY DYE ABSORBED HYDROPHILIC AND OLEOPHILIC IMAGES

[75] Inventor: Robert P. Held, Englishtown, N.J.

[73] Assignee: E. I. Du Pont de Nemours and Company, Wilmington, Del.

[21] Appl. No.: 42,553

[22] Filed: May 25, 1979

Related U.S. Application Data

[63] Continuation-in-part of Ser. No. 871,595, Jan. 23, 1978, abandoned.

[51] Int. Cl.$^3$ .......................... G03C 5/00; G03F 7/02
[52] U.S. Cl. ........................................ 430/17; 430/18; 430/281; 430/292; 430/293; 430/294; 430/302; 430/331
[58] Field of Search ............... 430/292, 293, 294, 302, 430/331, 17, 18, 281

[56] References Cited

U.S. PATENT DOCUMENTS

| | | | |
|---|---|---|---|
| 3,060,023 | 10/1962 | Burg et al. | 430/254 |
| 3,634,087 | 1/1972 | Houle et al. | 430/293 |
| 3,787,213 | 1/1974 | Gervay et al. | 430/292 |
| 3,888,672 | 6/1975 | Lee | 430/256 |
| 4,147,549 | 4/1979 | Held | 430/273 |

*Primary Examiner*—J. Travis Brown

[57] ABSTRACT

Photopolymerized elements having addition polymerized and unpolymerized image areas comprise a support bearing a layer having hydrophilic or oleophilic polymerized image areas and unpolymerized areas of opposite character, at least one of the image areas having absorbed therein a dye of like character. The dye absorbed photopolymerized elements are prepared after imagewise exposure by leaching out ethylenically unsaturated compound in the unexposed areas and absorbing a dye of like character and solvent carrier for the dye into at least one of the image areas. The dye and carrier mixture are capable of swelling the image areas wherein the dye is absorbed. The absorbed dye is not capable of being transferred from the element. Positive and negative working color copies are produced useful in overlay or projection applications.

17 Claims, No Drawings

PHOTOPOLYMERIZED ELEMENTS HAVING SELECTIVELY DYE ABSORBED HYDROPHILIC AND OLEOPHILIC IMAGES

Continuation-in-part of Ser. No. 871,595, Jan. 23, 1978, abandoned.

DESCRIPTION

Technical Field

This invention relates to photopolymerized elements and more particularly to photopolymerized elements having selectively dye absorbed hydrophilic and oleophilic image areas. Still more particularly, it relates to improved processes for preparing such dye absorbed photopolymerized elements.

BACKGROUND ART

The application of hydrophilic and oleophilic dyes to polymeric layers and the absorption of such dyes into polymeric layers including photopolymerized layers are known. When dye is absorbed into photopolymerized layers, generally the amount of dye absorbed is in the proportion and to the extent to which the polymeric layer has been unaffected by the exposing radiation. Thus, for example, in photopolymerized layers exposed through an image the dye would be absorbed into the non-imagewise exposed areas but no dye would be present in the exposed image areas.

Photopolymerizable compositions are either hydrophilic or oleophilic depending on the ethylenically unsaturated monomeric compound and polymeric binder present. In U.S. Pat. No. 4,147,549, there is disclosed an element useful for printing that after exposure and leaching contains both types of image areas. For example, the exposed image areas can be either hydrophilic or oleophilic and the unexposed image areas oleophilic or hydrophilic, respectively. It was found that positive or negative-working printing plates can be prepared by imagewise exposing a photopolymerizable element comprising an oleophilic or hydrophilic organic binder and a leachable hydrophilic or oleophilic ethylenically unsaturated compound, respectively, leaching out the unpolymerized ethylenically unsaturated compound and then treating the leached surface with an oleophilic ink. The ink covers solely the oleophilic image surface and is not absorbed into the oleophilic image. The ink plates are useful for printing but cannot be used in positive and negative-working overlay or projection applications directly, particularly such applications where in a single element hydrophilic and oleophilic dyes are absorbed in either the exposed or unexposed image areas.

DISCLOSURE OF INVENTION

In accordance with this invention there are provided exposed and developed photopolymerized elements having addition polymerized and unpolymerized image areas which comprise a support bearing over its entire surface a photopolymer layer containing said image areas, the addition polymerized image areas consisting essentially of a hydrophilic or oleophilic polymeric binder and polymerized ethylenically unsaturated monomer of hydrophilic or oleophilic character opposite that of the polymeric binder, and the unpolymerized image areas consisting essentially of said binder and being substantially free of ethylenically unsaturated monomer, the addition polymerized image areas being either hydrophilic or oleophilic in character and the unpolymerized image areas being opposite in character to the addition polymerized image areas, the improvement wherein a hydrophilic or oleophilic dye is absorbed into the hydrophilic or oleophilic areas, respectively, and is not capable of being transferred from the element.

In accordance with this invention there is also provided a method of preparing a dye absorbed, exposed and developed photopolymerized element as described above comprising:

(a) exposing to actinic radiation imagewise an element comprising a support bearing a layer of a photopolymerizable material which is comprised of a polymerization initiator, a macromolecular organic polymeric binder, and an addition polymerizable ethylenically unsaturated leachable compound, (b) leaching said ethylenically unsaturated compound from the binder in the unexposed areas of the layer, leaving the binder remaining in said areas, and (c) applying a hydrophilic or oleophilic dye and solvent carrier for the dye to the leached layer whereby the dye is absorbed into the hydrophilic or oleophilic image areas, respectively, the dye and carrier mixture being capable of swelling the image areas wherein the dye is absorbed, and the dye is incapable of being transferred from the element.

While the dye absorbed elements and process of making the elements are described in the singular with respect to the binder and monomer, this disclosure also includes the plural, since combinations of binders and monomers can be used. The term "leaching" imports removal of the monomer by any means, usually with a solvent developer. The photosensitive layer may also contain an addition polymerization initiator and other adjuvants such as fillers, dyes, and plasticizers which do not affect the hydrophilic or oleophilic character of the layer, and it may be laminated with a strippable protective cover layer. When a protective layer is used either the layer of the support must of necessity be transparent to actinic radiation used to image the layer and the cover layer would be removed at least before leaching.

As used in the disclosure of this invention and the appended claims, the term "solvent developer" means a solvent or solvent mixture which can leach residual unpolymerized monomer from binder and polymerized monomer; that is, a solvent or solvent mixture which can permeate the photosensitive layer and dissolve or remove the unpolymerized monomer without substantially dissolving either binder or polymerized monomer. Similarly, the leachable monomer is an addition polymerizable ethylenically unsaturated compound and is soluble in the solvent developer in which the binder and polymerized monomer are significantly less soluble. Oleophilic image areas and hydrophilic image areas are formed by leaching. In the dye absorbed elements, the oleophilic image areas absorb oleophilic dye and its solvent carrier while the hydrophilic image areas absorb hydrophilic dye and its solvent carrier. The term "dye absorbed elements" means that the oleophilic and/or hydrophilic dye absorbed into its respective image area is not capable of being transferred from the element at ambient conditions. Thus the absorbed dye is permanently affixed in the element. The term "solvent carrier" means a liquid that is a solvent for the particular oleophilic or hydrophilic dye and in the presence of the oleophilic or hydrophilic dye swells the respective image areas of the leached photopolymerized element without dissolving or removing the image areas.

The dye absorbed photopolymerized elements are extremely versatile in that they can be used in the form of positive-working and negative-working elements each containing a hydrophilic, oleophilic or combination of these dye types.

The photopolymerizable elements in which dye is absorbed comprise a support, a photosensitive layer or stratum and may have a strippable protective cover layer. The photosensitive layer contains an oleophilic polymeric binder which is substantially insoluble in the solvent developer, a solvent soluble, ethylenically unsaturated monomer capable of undergoing photoinitiated addition polymerization to a hydrophilic polymer which is substantially insoluble in the solvent developer, and an effective amount of a polymerization initiator activatable by actinic radiation and inactive thermally below 85° C. To prepare a positive-working dye absorbed element, the element is exposed to actinic radiation through a process transparency, the protective cover layer is stripped away, and the surface of the exposed stratum is washed with a solvent developer which leaches monomer from the unexposed areas of the stratum. The resulting stratum contains positive, oleophilic image areas from which the monomer has been leached and complimentary negative, hydrophilic image areas comprised of the hydrophilic polymer formed and polymeric binder. An oleophilic dye and solvent carrier are applied to the leached element, the oleophilic dye being absorbed solely into the oleophilic image areas. Conversely, a negative-working dye absorbed element can be prepared from a similar element by applying a hydrophilic dye and solvent carrier to the leached element, the hydrophilic dye being absorbed solely into the hydrophilic image areas.

In an equally preferred aspect of this invention dye absorbed elements are prepared from a photosensitive element which comprises a hydrophilic polymeric binder which is substantially insoluble in the solvent developer, and the solvent soluble monomer is a monomer capable of undergoing photoinitiated polymerization to an oleophilic polymer which is substantially insoluble in the solvent developer. To prepare a positive-working dye absorbed element the element is exposed to actinic radiation through a process transparency, the protective cover layer is removed, and the surface of the exposed stratum is washed with a solvent developer. The resulting stratum contains negative, oleophilic image areas comprised of the oleophilic polymer formed and polymeric binder, and complementary positive hydrophilic image areas from which the monomer has been leached. A hydrophilic dye and solvent carrier is applied to the leached element, the hydrophilic dye being absorbed solely into the hydrophilic image areas. Conversely, a negative-working dye absorbed element can be prepared from a similar element by applying an oleophilic dye and solvent carrier to the leached element, the oleophilic dye being absorbed solely into the oleophilic image areas.

Solvent developers particularly useful in preparing the dye absorbed elements include water; ethanol; 2-methoxyethanol; and solvent mixtures like water/ethanol, water/acetone and water/polyoxyethylene oleyl ether. Of these, water is particularly preferred. As is apparent to one with ordinary skill in the art, the leaching effect during development can be optimized by adjusting the temperature of the solvent developer.

Conventional milling, mixing of and solution techniques can be used in making the photopolymerizable compositions, the particular technique varying with the differences in properties of the respective components. The elements useful in this invention are conveniently prepared by dissolving the components of the photosensitive layer in a volatile solvent such as acetone, trichloroethylene, or a low molecular weight alcohol; coating the solution on a support, such as a plastic film or a paper or brushed aluminum sheet, by skim coating, doctor blade coating or other conventional coating technique; and allowing the solvent to evaporate. A protective cover layer may then be applied to the surface of the photosensitive layer. Besides solvent casting the photosensitive layer may be prepared by any other conventional technique, for example, hot melt coating, hot pressing, calendering or extrusion onto the support. The binder is present in an amount from 10 to 90 percent by weight, and the monomer may comprise 90 to 10 percent by weight of the composition. The photoinitiator is present in an amount up to 10 percent or more based on the weight of the composition.

Preferred oleophilic binders useful in preparing the dye absorbed elements of this invention are film forming polymers or macromolecular colloids which have molecular weights above 10,000, and are substantialy insoluble in solvent developers used, e.g., hot water. Such suitable binders include poly(caprolactone); polyacrylate and alpha-alkyl polyacrylate esters, e.g., polymethacrylate, polymethyl methacrylate and polyethyl methacrylate; vinylidene chloride copolymers, e.g., vinylidene chloride/acrylonitrile, vinylidene chloride/methacrylate and vinylidene chloride/vinyl acetate copolymers, ethylene/vinyl acetate copolymers; polyethylene; polyvinyl esters, e.g., polyvinyl acetate/acrylate, polyvinyl acetate/methacrylate and polyvinyl acetate; copolyesters, e.g., those prepared from the reaction product of a polymethylene glycol of the formula $HO(CH_2)_nOH$, wherein n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic, sebacic and adipic acids; nylons or polyamides, e.g., N-methoxymethyl polyhexamethylene adipamide; synthetic rubbers, e.g., butadiene/acrylonitrile copolymers, and chloro-2-butadiene-1,3-polymers; block copolymers, e.g., polystyrene-polybutadiene-polystyrene and polystyrene-polyisoprene; polyvinyl chloride and copolymers, e.g., polyvinyl chloride/acetate; polyvinyl acetal, e.g., polyvinyl butyral, polyvinyl formal; polyurethanes; polycarbonates; polystyrene; phenolic resins; and melamine-formaldehyde resins.

Preferred hydrophilic binders useful in preparing the dye absorbed elements of this invention are film forming polymers or macromolecular colloids which have molecular weights above 10,000, and are substantially insoluble in solvent developers used, e.g., water. Such suitable binders include polyvinyl alcohol; cellulose; cellulose ester, e.g., cellulose acetate succinate and cellulose acetate butyrate; cellulosic ethers, e.g., methyl cellulose, ethyl cellulose and benzyl cellulose; and polyethylene oxides having average molecular weights to about 1,000,000 and ethers of such polyethylene oxides.

Suitable leachable hydrophilic monomers useful in preparing dye absorbed elements of this invention are free-radical initiated, chain propagating, addition photopolymerizable ethylenically unsaturated compounds which are substantially soluble in a solvent developer and which upon photoinitiated polymerization form hydrophilic polymers which are substantially insoluble in the solvent developer. Particularly preferred monomers of this type are those containing one or more of the group—$(CH_2-CH_2-O)_x$ where $x$ is 2 or more. Such monomers are: triethylene glycol dimethacrylate, triethylene glycol diacrylate, tetraethylene glycol dimethacrylate, tetraethylene glycol diacrylate; and trimethylolpropane ethylene oxide adduct triacrylates and trimethacrylates and other ethylene oxide adduct monomers described in U.S. Pat. No. 3,380,831.

Suitable leachable oleophilic monomers useful in preparing dye absorbed elements of this invention are free-radical initiated, chain propagating, addition polymerizable ethylenically unsaturated compounds which are substantially soluble in a solvent developer and which upon photoinitiated polymerization form oleophilic polymers.

The following specific compounds are illustrative of this class; unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polypropylene glycols of molecular weight 200–500, and the like; unsaturated amides, particularly those of the alpha-methylene carboxylic acids, and especially those of alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(gamma-methacrylamidopropoxy)ethane, beta-methacrylamidoethyl methacrylate, N-(beta-hydroxyethyl)-beta-(methacrylamido)ethyl acrylate and N,N-bis(beta-methacryloxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon. The preferred monomeric compounds are difunctional, but monofunctional monomers can be used. Acrylic and methacrylic esters of polyhydroxy compounds such as pentaerythritol and trimethylol propane are also useful.

A preferred class of free-radical generating, addition polymerization initiators activatable by actinic light and thermally inactive at and below 85° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloro-anthraquinone, 2-methyl-anthraquinone, 2-ethyl-anthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-napthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in U.S. Pat. No. 2,760,863 and include vicinal ketaldonyl compounds, such as diacetyl, benzil, etc.; $\alpha$-ketaldonyl alcohols, such as benzoin, pivaloin, etc.; acyloin ethers, e.g., benzoin methyl and ethyl ethers, etc.; $\alpha$-hydrocarbon substituted aromatic acyloins, including $\alpha$-methylbenzoin, $\alpha$-allylbenzoin, and $\alpha$-phenylbenzoin.

Particularly preferred photoinitiators are the 2,4,5-triphenylimidazolyl dimers disclosed in U.S. Pat. No. 3,479,185. Also useful are the photoinitiating combinations disclosed in British Pat. No. 1,090,142, as well as the combinations of Michler's ketone with 2,4,5-triphenylimidazolyl dimers disclosed in U.S. Pat. No. 3,549,367. Other useful initiators and initiator systems are disclosed in U.S. Pat. Nos. 3,558,322 and 3,661,588.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil.

Suitable base or support materials include metals, e.g., steel and aluminum plates, sheets and foils, paper sheets, and films or plates composed of various film-forming synthetic resins or high polymers, such as the addition polymers and, in particular, vinylidene chloride copolymers with vinyl chloride, vinyl acetate, styrene isobutylene and acrylonitrile; vinyl chloride homopolymers and copolymers with vinyl acetate, styrene isobutylene and acrylonitrile; linear condensation polymers such as polyesters, e.g., polyethylene terephthalate, polyamide, e.g., polyhexamethylenesebacamide; polyimides, e.g., films as disclosed in U.S. Pat. No. 3,179,634 and polyester amide, e.g., polyhexamethylene-adipamide adipate. Fillers or reinforcing agents can be present in the synthetic resin or polymer bases such as the various fibers (synthetic, modified, or natural), e.g., cellulosic fibers, for instance, cotton, cellulose acetate, viscose rayon, paper, glass, wool; nylon and polyethylene terephthalate. These reinforced bases may be used in laminated form. Various anchor layers disclosed in U.S. Pat. No. 2,760,863 can be used to give strong adherence between the support and the photosensitive layer or, in the case of transparent support, pre-exposure through the support to actinic radiation can be used. The adhesive compositions disclosed in U.S. Pat. No. 3,036,913 are also effective.

Preferably, the elements useful in this invention have a protective cover layer to prevent contamination of, or damage to the photosensitive layer during storage, manipulation, or exposure. When necessary the protective cover layer may also act as an oxygen barrier improving exposure characteristics to actinic radiation. In general, the protective cover layer is transparent to actinic radiation, particularly when the support is an opague material. The protective cover layer may be a thin plastic film or sheet laminated to the surface of the photosensitive layer, e.g., polystyrene, polyethylene, polypropylene, polyethylene terephthalate, etc. After imagewise exposure the cover sheet is stripped off or delaminated and the photosensitive layer is developed. Alternatively the protective cover layer may be a coating of a macromolecular colloid or polymer applied to the surface of the photosensitive layer, e.g., polyvinyl alcohol, polyvinyl alcohol/polyvinyl pyrrolidone, gelatin, etc. Such overcoat layers are stripped by solvents after imagewise exposure, preferably by the solvent used as the solvent developer, e.g., hot water. The solvent, of course, should not remove the binder or photopolymer of the imaged photosensitive layer.

Since free-radical generating, addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs are customarily used at a distance of one and one-half to 20 inches (3.81 to 50.8 cm) from the photopolymerizable layer. It is noted, however, that in certain circumstances it may be advantageous to expose with visible light, using a photoinitiator sensitive in the visible region of the spectrum, e.g., 9,10-phenanthrenequinone or a combination of a sensitizing dye such as methylene blue with an initiator. In such cases, the radiation source should furnish an effective amount of visible radiation. Many of the radiation sources listed above furnish the required amount of visible light.

After an image photosensitive element has been developed by leaching it can be given an overall post exposure to actinic radiation to polymerize any residual monomer within the layer thereby preventing migration to the monomer-free area during subsequent storage and use.

After the ethylenically unsaturated compound is leached in the unexposed areas of the layer, a hydrophilic or oleophilic dye in a solvent carrier for the dye is applied to the leached element. The dyes can be applied in any manner known to those skilled in the art, e.g., by dipping, swabbing, spraying, etc., generally at normal room temperature. The dying can be performed at elevated temperatures, if desired, but care must be taken to avoid either evaporating prematurely the solvent carrier or affecting the solvent carrier ability to swell the image areas to be dyed. The dye and its solvent carrier should not swell or only have a minimal swelling effect on the non-dye absorbed image areas.

Suitable dyes and solvent carriers for preparing the dye absorbed elements include:

Hydrophilic dyes to be used with appropriate solvent carriers—C.I. Acid Yellow 5, 6, 36 and 42; C.I. Basic Yellow 12; C.I. Acid Orange 30, 47 and 80; C.I. Basic Orange 29; C.I. Acid Red 9, 51, 87, 114 (formerly 124), 186 and 356; C.I. Basic Red 2; C.I. Acid Violet 9, 17, 41 and 87; C.I. Basic Violet 1; C.I. Acid Blue 42, 53, 59, 83 and 116; C.I. Basic Blue 3; C.I. Acid Green 44 and 51; C.I. Basic Green 1; C.I. Acid Brown 34 and 41; C.I. Basic Brown 1; and C.I. Acid Black 5 and 99.

Hydrophilic solvent carriers which can be used singly or in combination: water; ethanol; methanol; propanol; ketones, such as acetone, Cellosolve, ethyl acetate, etc.

Oleophilic dyes to be used with appropriate solvent carriers: C.I. Solvent Yellow 14, 18, 29 and 72; C.I. Solvent Orange 8, 13 and 43; C.I. Solvent Red 5, 19 and 60; C.I. Solvent Violet 13; C.I. Solvent Blue 11, 58 and 60; C.I. Solvent Green 3; C.I. Solvent Brown 10 and 13; and C.I. Solvent Black 12.

Oleophilic solvent carriers which can be used singly or in combination:

(a) Hydrocarbons, both aliphatic and aromatic, e.g., white spirit, mineral oil, turpentine, benzene, toluene, xylene, petroleum ether, hexane, etc.

(b) Chlorinated hydrocarbons, e.g., carbon tetrachloride, tetrachloroethylene(perchloroethylene) trichloroethylene, 1,1,1-trichloroethane, methylene chloride, etc.

(c) linseed oil, oleic acid and stearic acid.

BEST MODE FOR CARRYING OUT THE INVENTION

The best mode is illustrated in Example 2 wherein an oleophilic binder, poly(methyl methacrylate), and a hydrophilic ethylenically unsaturated compound, polyoxyethyl trimethylolpropane triacrylate are used; and in Example 3 wherein a hydrophilic binder, cellulose acetate butyrate, and an oleophilic ethylenically unsaturated compound, trimethylolpropane trimethacrylate, are used. Example 2 illustrates the formation of a negative image with a hydrophilic dye absorbed in the hydrophilic image areas as well as the formation of a positive image with an oleophilic dye absorbed in the oleophilic image areas. Example 3 illustrates the formation of a positive image with a hydrophilic dye absorbed in the hydrophilic image areas as well as a negative image with an oleophilic dye absorbed in the oleophilic image areas.

INDUSTRIAL APPLICABILITY

The dye absorbed elements of the invention are useful as positive or negative-working transpaent color copies for overlay or projection applications. The dye absorbed elements are easily prepared and are versatile since it is possible to obtain either a positive or negative image from the same leached element. It is also possible to absorb both the hydrophilic dye and the oleophilic dye in the different type image areas of the same element.

EXAMPLES

The invention will be illustrated by the following examples:

EXAMPLE 1

A coating solution is prepared having the following composition:

| | |
|---|---|
| Poly(methyl methacrylate) (M.W. 30,000) | 40.9 g |
| Polyoxyethyl trimethylolpropane triacrylate (average M.W. 1,000) | 46.9 g |
| Polyoxyethylene lauryl ether (M.W. 362) | 8.16 g |
| 2-O-chlorophenyl-4,5-bis(m-methoxyphenyl)imidazolyl dimer | 3.27 g |
| 2-Mercaptobenzothiazole | 0.327 g |
| 2-(Stilbyl-4″)-naphtho-1′,2′; 4,5)-1,2,3-triazole-2″-sulfonic acid phenyl ester | 0.327 g |
| 2,2′-Dihydroxy-4 methoxybenzophenone | 0.163 g |
| Methylene chloride to make | 400.0 g |

The coating solution is coated with a doctor knife to a wet thickness of 0.0008 inch (0.02 mm) on a subbed 0.004 inch (0.1 mm) thick polyethylene terephthalate support made according to Example IV of U.S. Pat. No. 2,779,684, and is allowed to dry. The dried coating is laminated with a 0.001 inch (~0.025 mm) thick polyethylene terephthalate cover sheet. A sample of the element is exposed for 13 seconds through a process transparency with a xenon arc source (nuArc Platemaker, Model FT 26L of the flip-top type, manufactured by nuArc Co., Inc.). The cover sheet is stripped off, and the element is washed for approximately 30 seconds with water at ~21° C. The sample is dried and Dr. P. H. Martin's Synchromatic Transparent Water Color #35 Scarlet, B Aronstein & Co., New Hyde Park, New York, is applied to the sample, and the sample is dried again. The dye is absorbed into the exposed hydrophilic areas, containing the polymerized monomer and binder. The dyed sample has high density background areas with clear untinted unexposed image areas where the monomer has been leached out.

EXAMPLE 2

A coating solution is prepared having the following composition:

| | |
|---|---|
| Poly(methyl methacrylate) (M.W. 30,000) | 40.0 g |
| Polyoxyethyl trimethylolpropane triacrylate (aver. M.W. 1,000) | 40.0 g |
| Polyoxyethylene lauryl ether | 10.0 g |
| 2-O-chlorophenyl-4,5 diphenyl-imidazolyl dimer | 2.0 g |
| 2-Mercaptobenzoxazole | 1.5 g |
| 2-(Stilbyl-4")-(naphtho-1',2'; 4, 5)-1,2,3-triazole-2"-sulfonic acid phenyl ester | 0.3 g |
| 2,2'-Dihydroxy-4-methoxybenzophenone | 0.1 g |
| Methylene chloride to make | 376.0 g |

The coating solution is coated on a support and laminated with a cover sheet as described in Example 1. Two samples of the element are exposed through a process transparency as described in Example 1 for 30 seconds, rinsed with cold water at about 21° C., and are dried. To one sample is applied C.I. Acid Red 186 in ethanol solvent to give a negative image with the dye absorbing into the exposed, hydrophilic areas of the sample where the polymerized monomer and binder remain.

To the second sample is applied a solution of C.I. Solvent Red 114 in a hexane/toluene mixture. This sample shows a positive image with preferential absorption of the dye in the unexposed areas where the oleophilic binder remains.

EXAMPLE 3

A coating solution is prepared having the following composition:

| | |
|---|---|
| Cellulose acetate/butyrate (17% butyrate) | 10.0 g |
| Trimethylolpropane trimethacrylate | 10.0 g |
| 2-O-chlorophenyl-4,5-diphenyl imidazolyl dimer | 0.4 g |
| 2-Mercaptobenzoxazole | 0.2 g |
| 2-(Stilbyl-4")-naptho-1',2'; 4,5)-1,2,3-triazole-2"-sulfonic acid phenyl ester | 0.2 g |
| Acetone to make | 200.0 g |

The coating solution is coated with a doctor knife to a wet thickness of 0.006 inch (0.15 mm) on a subbed 0.004 inch (0.101 mm) thick polyethylene terephthalate support made according to Example IV of Alles U.S. Pat. No. 2,779,684, and the coating is allowed to dry. The dried coating is laminated at 100° C. with a 0.001 inch (0.025 mm) thick polypropylene cover sheet. Three samples of the element are exposed through process transparencies with the nuArc ® light source described in Example 1 for 40 second. The cover sheets are stripped and the elements are washed with ethanol. To one sample is applied Dr. P. H. Martin's Synchromatic Transparent Water Color #7A Moss Rose dye. The dye is absorbed into the unexposed, hydrophilic areas where the hydrophilic binder remained and the oleophilic monomer has been leached out to give a positive image.

A second sample is treated with another hydrophilic dye, C.I. Solvent Red 114, dissolved in a mixture of about 85 percent by volume ethanol and about 15% by volume of acetone (Dye Solution 1). Dye is absorbed into the unexposed, hydrophilic areas leaving the exposed areas clear to give a positive image.

An oleophilic dye comprising a solution of C.I. Solvent Blue 11 in a mixture of petroleum ether and about 5 percent by volume of methylene chloride (Dye Solution II) is applied to the third sample. The dye is absorbed into the exposed oleophilic areas, leaving the unexposed areas clear to give a negative image.

EXAMPLE 4

A coating solution is prepared having the following composition:

| | |
|---|---|
| Poly(methyl methacrylate) (M.W. 30,000) | 40.0 g |
| Polyoxyethyl trimethylolpropane triacrylate (aver. M.W. 1,000) | 30.0 g |
| 2-O-chloro-4,5-bis(m-methoxyphenyl)-imidazolyl dimer | 3.27 g |
| 2-Mercaptobenzoxazole | 1.5 g |
| 2-(Stilbyl-4")-(naphtho-1',2'; 4,5)-1,2,3-triazole-2"-sulfonic acid phenyl ester | 0.3 g |
| 2,2'-Dihydroxy-4-methoxybenzophenone | 0.1 g |
| Methylene chloride to make | 336.0 g |

The coating solution is coated on a support, laminated with a cover sheet, dried as described in Example 1. Three samples are then exposed as described in Example 1 for 40 seconds. They are washed with water at about 21° C. and are dried. The samples have unexposed, oleophilic areas where the binder remained and the monomer has been leached out, and exposed hydrophilic areas comprising polymerized, hydrophilic monomer and binder.

To one sample is applied Dr. P. H. Martin's Synchromatic Transparent Water Color #10 Sepia dye. The dye is absorbed into the exposed areas leaving the unexposed areas clear to give a negative image.

Oleophilic dyes, C.I. Solvent Yellow 29 in petroleum ether and Dye Solution II, are applied to two different samples. The dyes are absorbed into the unexposed oleophilic areas leaving the exposed hydrophilic areas clear to give a positive image.

EXAMPLE 5

A coating solution is prepared having the following composition:

| | |
|---|---|
| Vinyl chloride/vinyl acetate/vinylidene chloride terpolymer | 10.0 g |
| Polyoxyethyltrimethylolpropane triacrylate (aver. M.W. 1,000) | 10.0 g |
| Triethylene glycol diacetate | 2.0 g |
| 2-Ethylanthraquinone | 0.3 g |
| Methyl chloride to make | 80.0 g |

The solution is coated with a doctor knife to a wet thickness of 0.006 inch (0.15 mm) on the polyethylene terephthalate support of Example 1, dried, and laminated with a 0.001 inch (0.025 mm) thick polypropylene cover sheet. Two prepared samples of the element are exposed through process transparencies as described in Example 1 for 45 seconds. The cover sheets are removed, and the elements are washed with water at 32.2° C. for about 15 seconds.

Dye Solution I disclosed in Example 3 is applied to the first sample and is preferentially absorbed into the exposed hydrophilic areas leaving the unexposed oleophilic areas clear to give a negative image.

Dye Solution II disclosed in Example 3 is applied to the second sample and is preferentially absorbed into the unexposed oleophilic areas leaving the exposed hydrophilic areas clear giving a positive image.

EXAMPLE 6

A coating solution is prepared having the following composition:

| | |
|---|---|
| Poly(methyl methacrylate) (M.W. 30,000) | 10.0 g |
| Tetraethylene glycol dimethacrylate | 10.0 g |
| Triethylene glycol diacetate | 4.0 g |
| 2-O-chlorophenyl-4,5-bis(m-methoxyphenyl)imidazolyl dimer | 0.40 g |
| 2-Mercaptobenzothiazole | 0.04 g |
| 2-(Stilbyl-4″)-(naptho-1′,2′;4,5,)-1,2,3-triazole-2″-sulfonic acid phenyl ester | 0.05 g |
| Methylene chloride to make | 80.0 g |

An element is prepared from this solution as described in Example 5. The element is exposed as described in Example 1 for 55 seconds. The cover sheet is removed and the element is developed by washing with 50/50 volume percent ethanol/water solution.

Two samples of the element are treated respectively with dye solutions used in Example 5. In the first sample, treated with Dye Solution I, the dye is absorbed into the exposed hydrophilic areas, leaving the unexposed oleophilic areas clear to give a negative image. In the second sample, treated with Dye Solution II, the dye is absorbed into the unexposed oleophilic areas leaving the unexposed hydrophilic areas clear to give a positive image.

EXAMPLE 7

A coating solution is prepared having the following composition:

| | |
|---|---|
| Poly(caprolactone) (aver. M.W. 40,000) | 10.0 g |
| Polyoxyethyltrimethylolpropane triacrylate (aver. M.W. 1,000) | 10.0 g |
| Polyoxyethylene oleyl ether (M.W. 356) | 2.0 g |
| 2-O-chloro-4,5-bis(m-methoxyphenyl)-imidazolyl dimer | 0.40 g |
| 2-Mercaptobenzothiazole | 0.05 g |
| 2-(Stilbyl-4″)-(naptho-1′,2′;4,5)-1,2,3-triazole-2″-sulfonic acid phenyl ester | 0.05 g |
| Methyl ethyl ketone/methylene chloride (90/10 parts by volume) to make | 150.0 g |

An element is prepared from this solution as described in Example 5. The element is exposed as described in Example 1 for 45 seconds. The cover sheet is removed and the element is developed by washing for 15 seconds with warm water at 32.2° C.

Two samples are treated as described in Example 5, Dye Solution I giving a negative image, and Dye Solution II giving a positive image as described in that example.

EXAMPLE 8

A coating solution is prepared having the following composition:

| | |
|---|---|
| Poly(methyl methacrylate) (M.W. 30,000) | 10.0 g |
| Triethylene glycol dimethacrylate | 12.0 g |
| Triethylene glycol diacetate | 2.0 g |
| 2-O-chlorophenyl-4,5-diphenyl-imidazolyl dimer | 0.40 g |
| 2-Mercaptobenzothiazole | 0.04 g |
| 2-(Stilbyl-4″)-(naptho-1′,2′;4,5)-1,2,3-triazole-2″-sulfonic acid phenyl ester | 0.05 g |
| Methylene chloride to make | 80.0 g |

An element is prepared from this solution as described in Example 2. Two samples of the element are exposed as described in Example 1 for 45 seconds. The cover sheets are removed, and the samples are developed by washing with ethanol. The samples are then treated as described in Example 5 with the same results being obtained.

EXAMPLE 9

Example 4 is repeated through the leaching and drying steps. Dye Solution II is applied to the leached surface, the dyes being absorbed into the unexposed oleophilic image areas. Upon drying, 5 percent by weight of C.I. Acid Red 186 in water is applied to the above-described element, the dye being absorbed into the exposed hydrophilic image areas. The dyed element contains a blue dyed positive image with a pink background.

EXAMPLE 10

Example 3 is repeated through the leaching and drying steps. Dye Solution II is applied to the leached surface, the dye being absorbed into the exposed oleophilic image areas. Upon drying, Dye Solution I is applied to the above-described element, the dye being absorbed into the unexposed hydrophilic image areas. The dyed element contains a reddish pink dyed positive image with a blue background.

The foregoing examples illustrate that treating the imagewise exposed layer with a solvent leaches the polymerizable ethylenically unsaturated compound from the layer in the unexposed areas, so that the binder remains in those areas substantially without any ethylenically unsaturated compound. The unexposed, leached areas therefore consist essentially of binder. The exposed areas consist essentially of the binder and the polymerized ethylenically unsaturated compound and therefore have a hydrophilicity or oleophilicity different from that of the unexposed, leached areas. Both the unexposed and exposed areas are substantially in the same plane.

I claim:

1. In an exposed and developed photopolymerizable element having addition polymerized and unpolymerized image areas which comprises a support bearing over its surface a photopolymer layer containing said image areas, the addition polymerized image areas consisting essentially of a hydrophilic or oleophilic polymeric binder and polymerized ethylenically unsaturated monomer of hydrophilic or oleophilic character opposite that of the polymeric binder, and the unpolymerized image areas consisting essentially of said binder and being substantially free of ethylenically unsaturated monomer, the addition polymerized image areas being either hydrophilic or oleophilic in character and the unpolymerized image areas being opposite in character to the addition polymerized image areas, the improvement wherein a hydrophilic or oleophilic dye is absorbed into the hydrophilic or oleophilic image areas, respectively, and is not capable of being transferred from the element.

2. A dye absorbed photopolymerizable element according to claim 1 wherein the hydrophilic image areas have absorbed therein a hydrophilic dye and the oleophilic dye image areas have absorbed therein an oleophilic dye.

3. A positive working dye absorbed element according to claim 1 having oleophilic image areas consisting essentially of a polymeric binder and being substantially free of ethylenically unsaturated compound and hydrophilic image areas consisting essentially of said polymeric binder and a polymerized ethylenically unsaturated compound, the oleophilic image areas having absorbed therein an oleophilic dye.

4. A negative working dye absorbed element according to claim 1 having oleophilic image areas consisting essentially of a polymeric binder and being substantially free of ethylenically unsaturated compound and hydrophilic image areas consisting essentially of said polymeric binder and a polymerized ethylenically unsaturated compound, the hydrophilic image areas having absorbed therein a hydrophilic dye.

5. A positive working dye absorbed element according to claim 1 having hydrophilic image areas consisting essentially of a polymeric binder and being substantially free of ethylenically unsaturated compound and oleophilic image areas consisting essentially of said polymeric binder and a polymerized ethylenically unsaturated compound, the hydrophilic image areas having absorbed therein a hydrophilic dye.

6. A negative working dye absorbed element according to claim 1 having hydrophilic image areas consisting essentially of a polymeric binder and being substantially free of ethylenically unsaturated compound and oleophilic image areas consisting essentially of said polymeric binder and a polymerized ethylenically unsaturated compound, the oleophilic image areas having absorbed therein an oleophilic dye.

7. A dye absorbed element according to claim 3 wherein said polymeric binder is selected from polymethyl methacrylate, vinyl chloride/vinyl acetate/vinylidene chloride terpolymer, and polycaprolactone, and said ethylenically unsaturated compound is selected from polyoxyethyltrimethylolpropane triacrylate, tetraethylene glycol dimethacrylate, and triethylene glycol dimethacrylate.

8. A dye absorbed element according to claim 4 wherein said polymeric binder is selected from polymethyl methacrylate, vinyl chloride/vinyl acetate/vinylidene chloride terpolymer, and polycaprolactone, and said ethylenically unsaturated compound is selected from polyoxyethyltrimethylolpropane triacrylate, tetraethylene glycol dimethyacrylate, and triethylene glycol dimethacrylate.

9. A dye absorbed element according to claim 5 wherein said polymeric binder is selected from cellulose acetate butyrate, cellulose acetate, and hydroxypropyl cellulose, and said ethylenically unsaturated compound is selected from trimethylolpropane triacrylate, trimethylolpropane triacrylate, trimethylolpropane trimethacrylate, and polypropylene glycol ether of pentaerythritol tetraacrylate.

10. A dye absorbed element according to claim 6 wherein said polymeric binder is selected from cellulose acetate butyrate, cellulose acetate, and hydroxypropyl cellulose, and said ethylenically unsaturated compound is selected from trimethylolpropane triacrylate, trimethylolpropane triacrylate, trimethylolpropane trimethacrylate, and polypropylene glycol ether of pentaerythritol tetraacrylate.

11. A method of preparing a dye absorbed exposed and developed photopolymerized element of claim 1 comprising:
(a) exposing to actinic radiation imagewise an element comprising a support bearing a layer of photopolymerizable material which is comprised of a polymerization initiator, a macromolecular organic polymeric binder, and an addition polymerizable ethylenically unsaturated leachable compound,
(b) leaching said ethylenically unsaturated compound from the binder in the unexposed areas of the layer, leaving the binder remaining in said areas, and
(c) applying a hydrophilic or oleophilic dye and solvent carrier for the dye to the leached layer whereby the dye is absorbed into the hydrophilic or oleophilic image areas, respectively, the dye and carrier mixture being capable of swelling the image areas wherein the dye is absorbed, and the dye is incapable of being transferred from the element.

12. A method according to claim 11 of making a positive-working dye absorbed element wherein said polymeric binder is oleophilic, said ethylenically unsaturated compound is hydrophilic, and an oleophilic dye is applied to the oleophilic image areas.

13. A method according to claim 11 of making a negative-working dye absorbed element wherein said polymeric binder is oleophilic, said ethylenically unsaturated compound is hydrophilic, and a hydrophilic dye is applied to the hydrophilic image areas.

14. A method according to claim 11 of making a negative-working dye absorbed element wherein said polymeric binder is hydrophilic, said ethylenically unsaturated compound is oleophilic, and an oleophilic dye is applied to the oleophilic image areas.

15. A method according to claim 11 of making a positive-working dye absorbed element wherein said polymeric binder is hydrophilic, said ethylenically unsaturated compound is oleophilic, and a hydrophilic dye is applied to the hydrophilic image areas.

16. A method according to claim 11 wherein leaching comprises washing the element in a solvent developer in which the unpolymerized ethylenically unsaturated compound is soluble and in which the polymeric binder and polymerized ethylenically unsaturated compound are substantially less soluble.

17. A method according to claim 11 wherein, in either order, a hydrophilic dye and solvent carrier for the dye is absorbed into the hydrophilic image areas and an oleophilic dye and solvent carrier for the dye is absorbed into the oleophilic image areas, excess dye and solvent carrier being removed prior to the absorption of the second dye.

* * * * *